TRANSISTOR STRUCTURE WITH HEAT-CONDUCTIVE HOUSING FOR COOLING
Original Filed May 10, 1955

INVENTOR
James W. Lacy

BY Stevens, Davis, Miller & Mosher
ATTORNEYS

United States Patent Office 3,299,331
Patented Jan. 17, 1967

3,299,331
TRANSISTOR STRUCTURE WITH HEAT-CONDUCTIVE HOUSING FOR COOLING

James W. Lacy, Dallas Tex., assignor to Texas Instruments Incorporated, Dallas, Tex., a corporation of Delaware Continuation of application Ser. No. 507,319, May 10, 1955. This application May 11, 1966, Ser. No. 550,583
6 Claims. (Cl. 317—235)

This application is a continuation of application Serial No. 507,319, filed May 10, 1955, now abandoned.

The present invention relates to a novel transistor construction which is particularly characterized by the ability to dissipate large amounts of heat. More particularly, the present invention relates to a novel transistor construction of the grounded emitter type wherein a transistor bar is assembled in a fashion whereby increased heat dissipation is obtained.

The problem of dissipating heat is well recognized in the transistor art and this problem takes on a high degree of significance in connection with transistor arrangements and constructions which are used primarily as power units. It is well recognized that transistor action is somewhat limited by the temperature to which the transistor is subjected during operation. In a junction type transistor, temperatures in the vicinity of the junctions of from 100° C. to 175° C. depending on the material of the bar will cause a breakdown of the transistor action and hence it becomes a delicate problem to arrange transistor constructions for high power output without letting the temperature in the region of the junctions become excessive.

Various suggestions have been made in the prior art to provide a solution to this problem and enable transistors to operate at higher power outputs without unduly increasing the temperature in the region of the junctions. One example of a prior art technique is the use of a heat sink. In this arrangement, the transistor is prepared and mounted in an acceptable conventional manner on a base, such as for example, a conventional ceramic or glass pin base. These types of bases are commercially available. A can is placed over the transistor and sealed to the metalized edges of the base. This, of course, is one form of conventional construction as is known at the present time. The arrangement is not particularly suitable for dissipating heat from the transistor located within the can, and accordingly it has been suggested to provide what is known as a heat sink as an effort to remove the heat generated in the transistor itself. The heat sink, however, is not in direct contact with the transistor located within the can, but rather is in contact with the external surface of the can. A conventional heat sink is normally in the form of a plate having a pair of oppositely extending portions which can be bent around the can of the transistor unit. These portions will then embrace the can, and the plate of the heat sink can be welded to any convenient heat absorbing surface, as for example, the chassis in which the transistor is mounted. It thus becomes apparent that in this particular construction, it is necessary for the heat generated in the transistor itself to be passed first to the can of the transistor unit and then to be transferred to the embracing portions of the heat sink whereupon it is transferred to the plate of the heat sink and finally transferred to the heat absorbing surface which may be the chassis.

This solution to the problem has met with limited success since it will actually serve to dissipate a certain amount of heat; nevertheless, there are limitations which prevent the power output of the transistor from exceeding certain predetermined values. The biggest disadvantage of the construction resides in the fact that heat dissipation from the transistor itself depends upon an indirect exchange with the heat sink and accordingly this limiting factor prevents power outputs as desired.

It is a principal object of the present invention to provide a novel construction for a transistor unit which will provide a much better solution to the problem of heat dissipation. This novel construction is characterized by a direct heat exchange as distinguished from an indirect heat exchange whereby it is possible to dissipate considerably more heat from the transistor itself and thereby maintain the temperature in the region of the junctions within limits so that the transistor action will not be lost. At the same time, of course, much greater power outputs are possible with constructions designed according to the present invention and hence the desirability of utilizing this novel construction will be apparent.

According to the present invention, the transistor unit is arranged so that the element which serves to dissipate heat is in direct heat exchange with the transistor element rather than in indirect exchange as taught by the prior art.

It is a further object of the present invention to provide a novel construction for a transistor unit whereby greater power outputs will be obtainable than heretofore.

It is a further object of the present invention to provide a novel transistor assembly which will be characterized by simplicity of construction whereby it can be readily and economically fabricated without difficulty.

It is a still further object of the present invention to provide a novel transistor arrangement which will operate more efficiently from the standpoint of heat dissipation than arrangements heretofore advanced by the prior art.

Other and further objects of the present invention will become readily apparent from a detailed consideration of the following description when taken in conjunction with the drawings in which.

Figures 1, 2, 3:
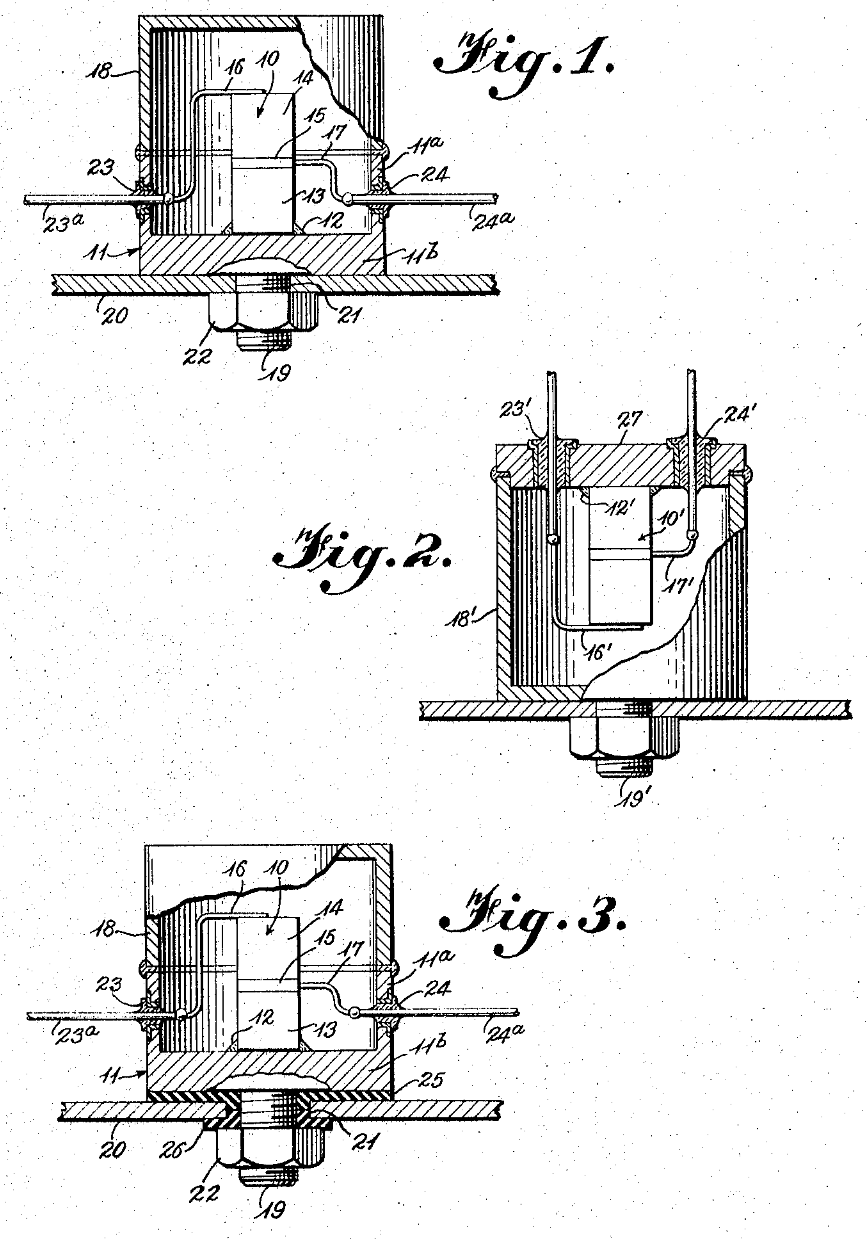
FIGURE 1 is a view in section through a transistor unit illustrating one form of the invention.
FIGURE 2 is a view in section through a transistor unit illustrating an alternative arrangement.
FIGURE 3 is a view in section through a transistor unit of the type shown in FIGURE 1 illustrating a method of electrically insulating the entire structure from the chassis on which it is mounted.

Referring now to the drawings, FIGURE 1 illustrates a transistor arrangement according to the present invention particularly useful in grounded emitter circuits, which, as will be appreciated, are the circuits most commonly used for power. As will be noted, a transistor bar, generally designated by the numeral 10 is soldered to a header 11 by any suitable means. The solder is designated in FIGURE 1 by the numeral 12. The transistor element is of the junction type with the emitter section 13 being the part of the bar which is soldered to the header 11. The remainder of the transistor bar 10 is composed of the collector part 14 and the base part 15. The transistor bar 10 may be of either the n-p-n type or it may be of the p-n-p type or other. Likewise the transistor may be a silicon, germanium or other type of transistor. The actual constitution of the bar 10 forms no part of the present invention as the principal concern at the present time is to provide an exceedingly good arrangement for dissipating heat which will be generated in the transistor bar during its operation. The header 11, as illustrated in FIGURE 1, is composed of any good heat transferring material, as for example, copper or brass, and may be in the form of a tubular wall portion 11*a* of a circular or polygonal cross-section closed at one end by an end plate portion 11*b*. A lead 16 is soldered to the end of the collector section 14 and a lead 17 is fixed to the base section 15. A can 18 encloses the bar 10 and is soldered or welded to the header wall 11*a*.

Projecting from the lower surface of the header 11 is a threaded bolt 19. As will be evident, it will be convenient to make the header 11 and the bolt 19 as a unitary construction. With the construction thus arranged, the assembly can be directly mounted onto a chassis as indicated by the numeral 20 in FIGURE 1. This is achieved by drilling or otherwise boring a suitable hole 21 in the chassis 20 and placing the header 11 directly in contact with the chassis 20 with the bolt 19 projecting through the opening 21. Alternatively the hole 21 can be tapped and bolt 19 threaded into the tapped hole 21. The chassis, as will be appreciated, is a metallic member normally characterized by good thermal properties. The assembly is held in place by means of a nut 22 which is threaded onto the bolt 19 and bears against the chassis 20.

The arrangement thus described provides an excellent way in which to dissipate heat from the transistor bar 10. The header 11, since it is in direct contact with the bar 10, will be in direct heat exchange therewith and a very convenient path for heat generated in the transistor bar 10 will be defined by the header 11. In order to finally remove the heat all together from the transistor bar 10, the end plate portion 11*b* of the header is, as above described, in direct contact with the chassis 20 and thus the heat will travel from the bar 10 through the header end plate 11*b* into the chassis 20. This arrangement has proven in use to be highly successful and it has been possible to obtain power dissipations of 5 watts and greater with corresponding increases in signal output. This, as will be appreciated, constitutes a remarkable advance over constructions heretofore known in the art.

The organization illustrated in FIGURE 1 is, of course, utilized in a grounded emitter circuit since the emitter section 13 of the transistor bar 10 is directly fixed onto the header 11 which is in contact with the chassis 20. It is extremely desirable in this assembly to maintain as great a surface area as is possible for heat transfer to the chassis and thus the header end plate portion 11*b* should remain solid and not be broken up or have holes drilled therein since this would tend to detract from its ability to transfer heat. Accordingly, the connections for the leads 16 and 17 in this particular construction are not brought out through the end plate portion 11*b*, but rather are brought out of the wall portion 11*a*. To accomplish this, the wall portion is provided with a pair of bores in which are located hermetically sealed insulated terminals 23 and 24. The leads 16 and 17 are attached to the terminal leads 23*a* and 24*a* respectively and by this means are brought to the exterior of the assembly for circuit connections. Whereas two such insulators are illustrated in FIGURE 1, it will, of course, be possible to employ a single large insulator having two terminals therethrough.

Another construction embodying the principles of the present invention is illustrated in FIGURE 2. In the arrangement of FIGURE 2, the bolt 19' is either attached to or made an integral part of the can 18'. The header 27 in this organization is a flat plate provided with insulated terminals 23' and 24' by which means connections to the leads 16' and 17' are brought out of the enclosure. As shown, the bar 10' is attached to the header 27 by solder 12' in the same manner as in FIGURE 1. It will be appreciated that the construction illustrated in FIGURE 2, although slightly inferior in heat transfer properties to the construction of FIGURE 1, lends itself to easier manufacturing techniques since, during the attachment of the bar 10' and the leads 16' and 17', the vision of the operator is not obstructed nor is his working space limited by any wall portions of the header as would be true for the construction shown in FIGURE 1.

The particular construction illustrated in FIGURE 1 is, as above mentioned of the grounded emitter type and the emitter section 13 of the transistor bar 10 is directly grounded to the chassis 20 through the intermediary of the heat dissipator element header 11. There are some circumstances, however, when it is desirable in a grounded emitter circuit to have additional resistance in the emitter circuit. Alternatively there are circumstances when it is desirable to employ the transistor unit not in a grounded emitter circuit, but rather in a grounded base or grounded collector circuit. Under these conditions, it will be necessary to use a construction such as illustrated in FIGURE 3. As will be noted in FIGURE 3, the header 11 is not directly mounted onto the chassis 20. Rather, a thin mica washer 25 underlies the header 11 spacing same from the chassis 20. The hole 21 in the chassis is slightly enlarged so that the bolt 19, when it projects therethrough, will be spaced from the wall portion of the chassis 20 which defines the hole 21. In order to electrically insulate the nut 22 threaded onto the bolt 19 from the chassis 20 a second thin washer 26 lies between the nut 22 and the chassis 20. It is within the purview of the invention to use individual washers 25 and 26 which are in no way attached to either the transistor assembly and more specifically to the header 11 or to the bolt 22. On the other hand, it is equally within the purview of the present invention to provide the washers 25 and 26 attached respectively to the header 11 and the nut 22. In either case it is an important aspect to provide a convenient means for the washers 25 and 26 to self center the bolt 19 in the hole 21 to eliminate all possible chance of the shank of the bolt 19 from touching against the sides of the hole 21. This can readily be accomplished by defining one or the other of the washers 25 and 26 with an in-turned flange or lip adapted to fit into the hole 21 in the space between the shank of bolt 19 and the chassis 20. As illustrated in FIGURE 3, both of the washers 25 and 26 are provided with the in-turned flange sections which fit into this space. It will be appreciated, however, that only one of the washers 25 and 26 need be characterized in this manner for the success of the assembly.

In the arrangement illustrated in FIGURE 3, a suitable lead can be connected to the end of the bolt 19 for the emitter circuit of the assembly and this lead may be connected to suitable resistance units or other components and can be grounded to the chassis whereupon the emitter section of the transistor bar will be first connected to a suitable resistance and then grounded. Alternatively, the arrangement illustrated in FIGURE 3 is equally adapted for use in a grounded base or grounded collector circuit. If the operation is of the grounded base type, then, of course, lead 17 will be connected to the chassis 20. For grounded collector operation, the lead 16 can be connected to the chassis 20 or alternatively the transistor bar, when mounted, can be inverted such that the collector section 14 will be in direct contact with the header 11 and the arrangement illustrated in FIGURE 1 then used.

The inclusion of the thin washers 25 and 26 will not detract substantially from the ability of the assembly to dissipate heat generated in the transistor bar 10 provided that the thickness of the washers 25 and 26 are controlled and the materials employed for them preselected to obtain good electrical insulating properties as well as good thermal properties. For this purpose, it has been found that mica is excellent for use since the two washers can be made extremely thin and thus will not substantially interfere with the heat dissipating properties of the assembly. Also mica is a fairly good heat transmitter composition in this particular assembly.

It is to be recognized that the method shown in FIGURE 3 of providing an electrically insulated mounting by means of the washers 25 and 26 is equally applicable to the embodiment shown in FIGURE 2 wherein the mounting bolt 19' is a part of the can 18' rather than the header.

Although the present invention has been shown and described with respect to particular forms, it will nevertheless be appreciated that various modifications and changes in the design and construction which are within the purview of a person skilled in this particular art are within the spirit, scope and contemplation of the present invention.

What is claimed is:

1. A transistor assembly comprising:

(a) a cup-shaped header having a base wall and a vertical wall portion, said header being composed of a material of high thermal conductivity;

(b) a transistor having one of its regions fixed directly to said header in good electrical and thermal contact therewith;

(c) a container of high thermal conductivity open at one end and closed at its other end surrounding said transistor and affixed to and being closed by said header at its open end, whereby said header and said container together define a completely enclosed space in which said transistor is located;

(d) a plurality of leads connected to said transistor and extending through said vertical wall portion of said header and insulated therefrom; and (e) an element composed of a material of high thermal conductivity attached to said base wall of said header for fixing said assembly to a supporting structure of good thermal characteristics, in heat exchange relationship therewith.

2. A transistor according to claim 1 wherein said plurality of leads are each comprised of a first conductive member extending through said vertical wall portion and a second conductive wire member connected between said first member and a region of said transistor.

3. A transistor according to claim 1 wherein said container is integrally fused to said header.

4. A transistor assembly comprising:

(a) a cup-shaped header having a base wall and a vertical wall portion, said header being composed of a material of high thermal conductivity;

(b) a transistor having one of its regions fixed directly to said header in good electrical and thermal contact therewith;

(c) a container of high thermal conductivity open at one end and closed at its other end surrounding said transistor and affixed to and being closed by said header at its open end, whereby said header and said container together define a completely enclosed space in which said transistor is located;

(d) a plurality of leads connected to said transistor and extending through said vertical wall portion of said header and insulated therefrom;

(e) an element composed of a material of high thermal conductivity attached to said base wall of said header for fixing said assembly to a supporting structure of good thermal characteristics, in heat exchange relationship therewith;

(f) a supporting structure of good thermal characteristics; and (g) insulating means for insulating said header and said element from said supporting structure.

5. A semiconductor assembly comprising:

(a) a cup-shaped header having a base wall and a vertical wall portion, said header being composed of a material of high thermal conductivity;

(b) a semiconductor device having one of its regions fixed directly to said header in good electrical and thermal contact therewith;

(c) a plurality of leads connected to said semiconductor device and extending through said vertical wall portion of said header and insulated therefrom; and (d) hermetic sealing means closing said cup-shaped header, whereby said semiconductor device is hermetically sealed within said header.

6. A semiconductor assembly comprising:

(a) a cup-shaped header having a base wall and a vertical wall portion, said header being composed of a material of high thermal conductivity;

(b) a semiconductor device having one of its regions fixed to said header, (c) a plurality of leads connected to said semiconductor device and extending through said vertical wall portion of said header and insulated therefrom; and (d) hermetic sealing means closing said cup-shaped header, whereby said semiconductor device is hermetically sealed within said header.

References Cited by the Examiner

UNITED STATES PATENTS

| | | | |
|---|---|---|---|
| 2,665,399 | 1/1954 | Lingel | 317—235 |
| 2,725,505 | 11/1955 | Webster et al. | 317—235 |
| 2,735,050 | 2/1956 | Armstrong | 317—235 |
| 2,751,528 | 6/1956 | Burton | 317—234 |
| 2,752,541 | 6/1956 | Losco | 317—235 |
| 2,759,133 | 8/1956 | Mueller | 317—235 |
| 2,763,822 | 9/1956 | Frola et al. | 317—235 |
| 2,790,940 | 4/1957 | Prince | 317—235 |
| 2,886,748 | 5/1959 | Barton | 317—235 |
| 2,962,396 | 11/1960 | Pankove | 148—1.5 |

FOREIGN PATENTS

| | | |
|---|---|---|
| 714,976 | 2/1954 | Great Britain. |

JOHN W. HUCKERT, *Primary Examiner.*

SAMUEL BERSTEIN, LLOYD McCOLLUM, *Examiners.*

GEORGE N. WESTBY, A. B. GOODALL, J. D. KALLAM, *Assistant Examiners.*